(12) United States Patent
Ausserlechner et al.

(10) Patent No.: US 9,588,134 B2
(45) Date of Patent: Mar. 7, 2017

(54) INCREASED DYNAMIC RANGE SENSOR

(75) Inventors: Udo Ausserlechner, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 921 days.

(21) Appl. No.: 13/468,203

(22) Filed: May 10, 2012

(65) Prior Publication Data
US 2013/0304422 A1  Nov. 14, 2013

(51) Int. Cl.
*G01P 3/487* (2006.01)
*G01D 21/02* (2006.01)
*G01R 33/07* (2006.01)
*G01R 33/09* (2006.01)
*G01D 1/14* (2006.01)

(52) U.S. Cl.
CPC .............. *G01P 3/487* (2013.01); *G01D 21/02* (2013.01); *G01R 33/07* (2013.01); *G01R 33/09* (2013.01); *G01D 1/14* (2013.01)

(58) Field of Classification Search
CPC ......... G01R 33/07; G01R 33/09; G01P 3/487; G01D 21/02; G01D 1/14
USPC .................................................. 702/151, 189
See application file for complete search history.

(56) References Cited

U.S. PATENT DOCUMENTS

| 5,583,297 | A  | * | 12/1996 | Stocker ..................... G01L 21/34 73/700 |
| 6,707,293 | B2 | * | 3/2004  | Wan et al. ............... 324/207.25 |
| 6,777,928 | B2 | * | 8/2004  | Ramirez ................. G01D 5/145 324/207.2 |
| 7,250,754 | B2 | * | 7/2007  | Godkin ..................... 324/207.24 |
| 7,768,083 | B2 | * | 8/2010  | Doogue ................. B82Y 25/00 257/422 |

(Continued)

FOREIGN PATENT DOCUMENTS

| CN | 102353911 A | 2/2012 |
| CN | 102426343 A | 4/2012 |

(Continued)

OTHER PUBLICATIONS

Honeywell, Magnetoresistive Sensors, 2003, Sensing and Control Honeywell, pp. 1-3.*

(Continued)

*Primary Examiner* — Alexander Satanovsky
*Assistant Examiner* — John Kuan
(74) *Attorney, Agent, or Firm* — Eschweiler & Potashnik, LLC

(57) ABSTRACT

Some aspects of the present disclosure provide for a sensor system having a large range between minimum and maximum allowed input quantities. In some embodiments, the sensor system has a nonlinear sensor and a linear sensor. The nonlinear sensor is generates a first nonlinear signal corresponding to a detected physical input quantity. The linear sensor generates a second linear signal corresponding to the detected physical input quantity. A signal processor receives the first nonlinear signal and the second linear signal and generates a composite output signal that corresponds to the detected physical input quantity. The composite output signal is a combination of the first nonlinear signal and the second linear signal that provides for a signal having a high sensitivity to small physical input quantities while avoiding saturation at large physical input quantities.

19 Claims, 7 Drawing Sheets

(56) References Cited

U.S. PATENT DOCUMENTS

| | | | |
|---|---|---|---|
| 8,362,765 | B2 | 1/2013 | Butzmann et al. |
| 8,395,382 | B2 | 3/2013 | Phan Le et al. |
| 2003/0164530 | A1* | 9/2003 | Robert et al. .............. 257/425 |
| 2003/0179478 | A1* | 9/2003 | Fang et al. .................... 360/31 |
| 2007/0200564 | A1* | 8/2007 | Motz et al. ................. 324/247 |
| 2012/0153946 | A1* | 6/2012 | van Veldhoven .... G01D 5/2451 324/252 |

FOREIGN PATENT DOCUMENTS

| | | | |
|---|---|---|---|
| EP | 1225453 | A2 | 7/2002 |
| EP | 1802988 | A1 | 7/2007 |
| JP | 2012-60379 | * | 3/2012 |
| WO | 2009037607 | A2 | 3/2009 |

OTHER PUBLICATIONS

Machine Translation of Patent application No. 2010-201078 (JP-2012-60379,Mar. 2012), Signal Processing Apparatus and Method,Program,and Data Recording medium,pp. 1-26.*

APGX Datasheet, Publication No. D023-72-895, BOC Edwards 2001.*

Sense & Control: Designing a Disc Magnet for use with Infineon GMR Sensors, Infineon, Application Note V1.0 Oct. 15, 2011, p. 1-19.

Candid Reig, et al., "Magnetic Field Sensors Based on Giant Magnetoresistance (GMR) Technology: Applications in Electrical Current Sensing", Sensors 2009, ISSN 1424-8220, www.mdpi.com/journal/sensors, p. 1-24.

* cited by examiner

INCREASED DYNAMIC RANGE SENSOR

BACKGROUND

Modern vehicles include a vast number of sensors. Such sensors provide information about the operation of a vehicle to a control unit, which can take an action based upon the information. For example, the control unit may be configured to provide data concerning the sensed information to a user or to generate a control signal that causes an actuator to perform an action (e.g., to deploy an airbag) if a sensed value is above a threshold.

Sensors may comprise linear sensors or nonlinear sensors. Linear sensors provide for an output signal that is a substantially linear function of the physical input quantity being detected (i.e., $S_{out}=a+b*Q_{in}$, where a and b are independent of Qin). Nonlinear sensors provide for an output signal that is not a linear function of the physical input quantity being detected (i.e., $S_{out}=a*Q_{in}^2+b*Q_{in}$).

DETAILED DESCRIPTION

Figure 1:
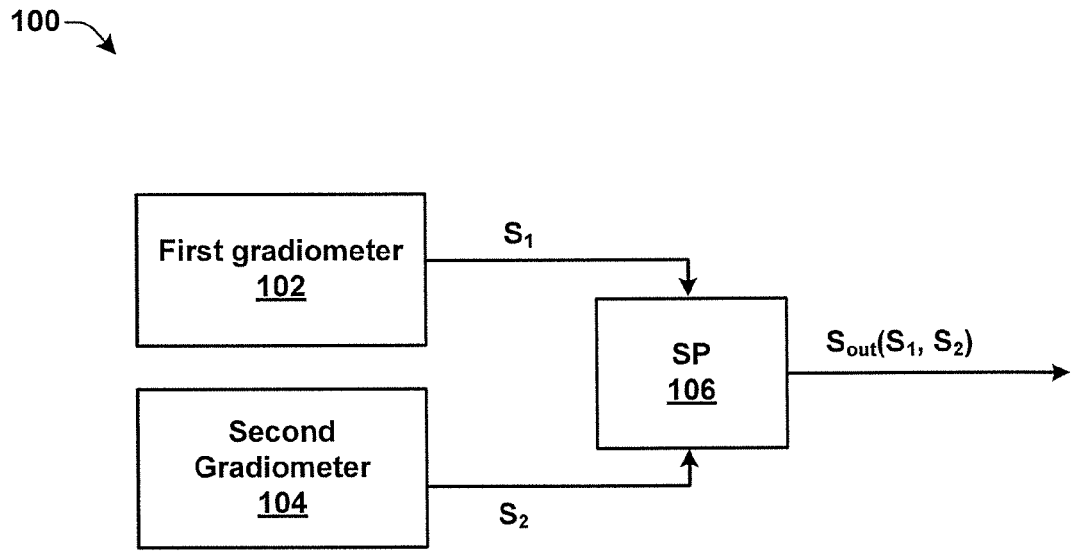
FIG. 1 illustrates a block diagram of a sensor system configured to detect a physical input quantity

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Nonlinear sensors are widely used in many sensing applications. This is because their nonlinear response to a physical input quantity makes them highly sensitive to small variations in the physical input quantity. However, at large physical input quantities nonlinear sensors are highly susceptible to saturation, a phenomenon wherein the output signal of a sensor does not increase in response to an increase in the physical input quantity. When a large physical input quantity drives a nonlinear sensor into saturation, its output signal no longer accurately corresponds to the physical input quantity, causing the sensor to malfunction.

Accordingly, some aspects of the present disclosure provide for a sensor system having a large range between minimum and maximum input quantities. In some embodiments, the sensor system comprises a nonlinear sensor and a linear sensor. The nonlinear sensor is configured to generate a first nonlinear signal corresponding to a detected physical input quantity. The linear sensor is configured to generate a second linear signal corresponding to the detected physical input quantity. A signal processor is configured to receive the first nonlinear signal and the second linear signal and to generate a composite output signal that corresponds to the detected physical input quantity. The composite output signal comprises a combination of the first nonlinear signal and the second linear signal that provides for a signal having a high sensitivity to small physical input quantities while avoiding saturation at large physical input quantities.

FIG. 1 illustrates a block diagram of a sensor system 100 configured to detect a physical input quantity by generating a composite output signal $S_{out}$ indicative of the physical input quantity.

The sensor system 100 comprises a first gradiometer 102 and a second gradiometer 104. The first and second gradiometers, 102 and 104, are configured to detect a spatial derivative of a physical input quantity. The first gradiometer 102 has a response that drives the first gradiometer into saturation at a first amplitude of the physical input quantity (e.g., at 5 mT), while the second gradiometer 104 has a response that drives the second gradiometer into saturation at a second amplitude of the physical input quantity (e.g., at 15 mT) that is substantially larger than the first amplitude. In some embodiments, the first gradiometer 102 comprises a linear sensor, while the second gradiometer 104 comprises a nonlinear sensor. In other embodiments, the first and second gradiometers 102, 104 may both comprise non-linear sensors having varying degrees of nonlinearity.

A signal processor 106 is configured to receive a first output signal $S_1$ from the first gradiometer 102 and a second output signal. $S_2$ from the second gradiometer 102. The signal processor 106 is configured to generate a composite output signal $S_{out}$ that is a function of the first signal $S_1$ and the second signal $S_2$. By generating the composite output signal $S_{out}$ based upon the first signal $S_1$ and the second signal $S_2$, the sensor system 100 is able to provide for accurate readings over a large range of physical quantities.

In various embodiments, the gradiometers 102,104 may comprise various order gradiometers. In some embodiments, the gradiometers comprise $0^{th}$ order gradiometers configured to detect the $0^{th}$ derivative of the physical quantity along a direction (i.e., the value of the physical quantity detected at a location of a single sensor element). In such an embodiment, the $0^{th}$ order gradiometer comprises a single sensor element at a single location. In other embodiments, the gradiometers may comprise higher order gradiometers, such as a $1^{st}$ order gradiometer configured to detect the $1^{st}$ order derivative of the quantity (i.e., the slope between the value of a physical quantity detected at two locations), a $2^{nd}$ order gradiometer configured to detect the 2nd order derivative, etc. The higher order gradiometers comprise more than one sensor element (e.g., a $1^{st}$ order gradiometer comprises two sensor elements at two locations, a $2^{nd}$ order gradiometer comprises three sensor elements at three locations, etc.

Figure 2A:
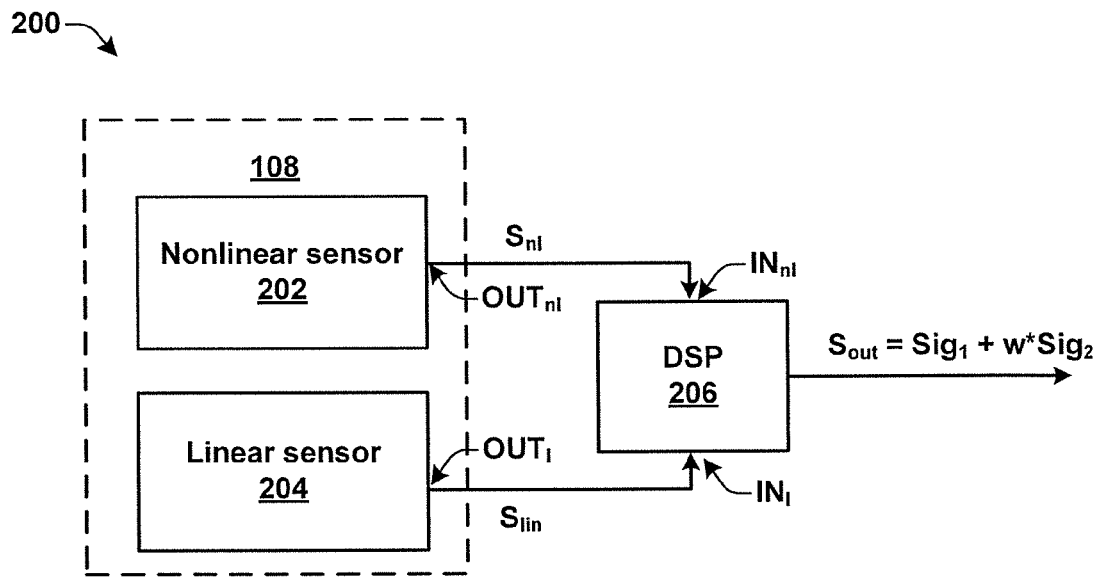
FIG. 2A illustrates a block diagram of a sensor system comprising a linear sensor and a nonlinear sensor.

FIG. 2A illustrates a block diagram of a sensor system 200 configured to detect a physical input quantity by generating a composite output signal $S_{out}$ indicative of the physical input quantity.

The sensor system 200 comprises one or more nonlinear sensors 202 that have a nonlinear response to the physical input quantity. The nonlinear response makes the nonlinear sensors 202 highly sensitive to small variations in the physical input quantity, but also exhibits a clear saturation if the physical input quantity exceeds a certain value. The nonlinear sensors 202 are configured to generate a first nonlinear signal $S_{nl}$ corresponding to the physical input quantity.

The sensor system 200 further comprises one or more linear sensors 204 that have a linear response the physical input quantity. The linear response provides for a lower sensitivity to small variations in the physical input quantity than the nonlinear sensors 202. However, the linear sensors do not undergo saturation when the physical input quantity exceeds the certain value. The linear sensors 204 are configured to generate a second linear signal $S_{lin}$ corresponding to the detected physical input quantity. It will be appreciated that the terms "linear sensor" and "linear signals" as provided herein refers to sensors/signals that are predominantly or substantially linear (e.g., sensors that have a response that is predominantly linear). In some embodiments, the linear sensor and the nonlinear sensor are comprised within a same sensor housing (e.g., an IC die, an IC package, etc.)

A signal processor 206 is configured to receive the first nonlinear signal $S_{nl}$ from the nonlinear sensors 202 and the second linear signal $S_{lin}$ from the linear sensors 204. In some embodiments, the signal processor 206 comprises one or more nonlinear input nodes $IN_{nl}$ connected to an output node $OUT_{nl}$ of the nonlinear sensors 202 and one or more linear input nodes $IN_{lin}$ connected to an output node $OUT_{lin}$ of the linear sensors 204. The one or more nonlinear input nodes $IN_{nl}$ are configured to receive the first nonlinear signal $S_{nl}$, and the one or more linear input nodes $IN_{lin}$ are configured to receive the second linear signal $S_{lin}$. The signal processor 206 is configured to generate a composite output signal $S_{out}$ that is a combination of the first nonlinear signal $S_{nl}$ and the second linear signal $S_{lin}$. By generating the composite output signal $S_{out}$ based upon the first nonlinear signal $S_{nl}$ and the second linear signal $S_{lin}$, the sensor system 200 is able to provide for accurate readings over a large range of physical quantities.

In some embodiments, the composite output signal $S_{out}$ comprises a weighted sum of the first nonlinear signal $S_{nl}$ and the second linear signal $S_{lin}$. In such embodiments, the first nonlinear signal $S_{nl}$ or the second linear signal $S_{lin}$ is multiplied by a weighting coefficient w (e.g., $S_{out}=S_{nl}+w*S_{lin}$). The weighting coefficient w may be chosen so as to decrease the influence of the first nonlinear signal $S_{nl}$ in operating conditions wherein the nonlinear sensors 202 provide for an inaccurate measurement of the physical input quantity and to increase the influence of the first nonlinear signal $S_{nl}$ in operating conditions where the nonlinear sensors 202 provide for an accurate measurement of the physical input quantity. Therefore, the resulting weighted sum emphasizes the signal providing a better response.

In some embodiments, the weighing coefficient w comprises a fixed value. In other embodiments, the weighting coefficient w comprises an assignable value that can be programmed into an on-chip memory (e.g., EEPROM) when the sensor circuit is matched with a quantity to be measured (e.g., an encoder wheel). In such an embodiment, the weighting coefficient may be set by a calibration process, for example. In yet other embodiments, the weighting coefficient w comprises a dynamic value determined by an algorithm configured to adjust the weighting factor w during operation. For example, the algorithm may be configured to adjust the weighting coefficient w when an air-gap changes or in response to a size of magnetic poles within an encoder wheel, to temperature or other parameters that the sensor is able to detect via additional circuitry, etc.

Furthermore, it will be appreciated that in various embodiments, the weighted sum may be chosen to emphasize different quantities in the composite output signal. For example, in some embodiments, the weighted sum may be chosen to emphasize the magnitude of measured signals (e.g., $S_{nl}$ or $S_{lin}$). In other embodiments, the weighted sum may be chosen to emphasis signals having a higher signal-to-noise-ratio (SNR). For example, in a region where the SNR of the linear sensors 204 is poor compared to the nonlinear sensors 202, the weighted sum is chosen so that the SNR of the composite output signal $S_{out}$ is dominated by the first nonlinear signal $S_{nl}$.

In various embodiments, the physical input quantity detected by the sensor system 200 may comprise such quantities as a magnetic field, an electric field, a temperature, a moisture content, a gas pressure, a mechanical stress or strain, an optical light, or a nuclear radiation, for example. In some embodiments, the physical input quantity may comprise a vector valued physical input quantity (i.e., a physical input quantity having a distinct orientation). For example, in some embodiments, the vector valued physical input quantity may comprise a magnetic field or an electric field. In some embodiments, the nonlinear sensors 202 and the linear sensors 204 are configured to detect the different components of a vector valued quantity. For example, the nonlinear sensors 202 may be configured to detect the vector valued quantity along a first component and the linear sensors 204 may be configured to detect the vector valued quantity along a second, orthogonal component.

In embodiments wherein the sensor system 200 is configured to measure a magnetic field value, the nonlinear sensors 202 may comprise one or more magnetoresistors (MRs) (e.g., anisotropic MRs, giant MRs, colossal MRs, tunneling MRs, etc.), while the linear sensors 204 may comprise one or more Hall plate. Depending on the type of nonlinear sensor used, additional components may be used within the sensor system 200. For example, for nonlinear sensors 202 comprising an AMR sensor, a bias magnet is attached to the sensor die or to the sensor package.

Figure 2B:
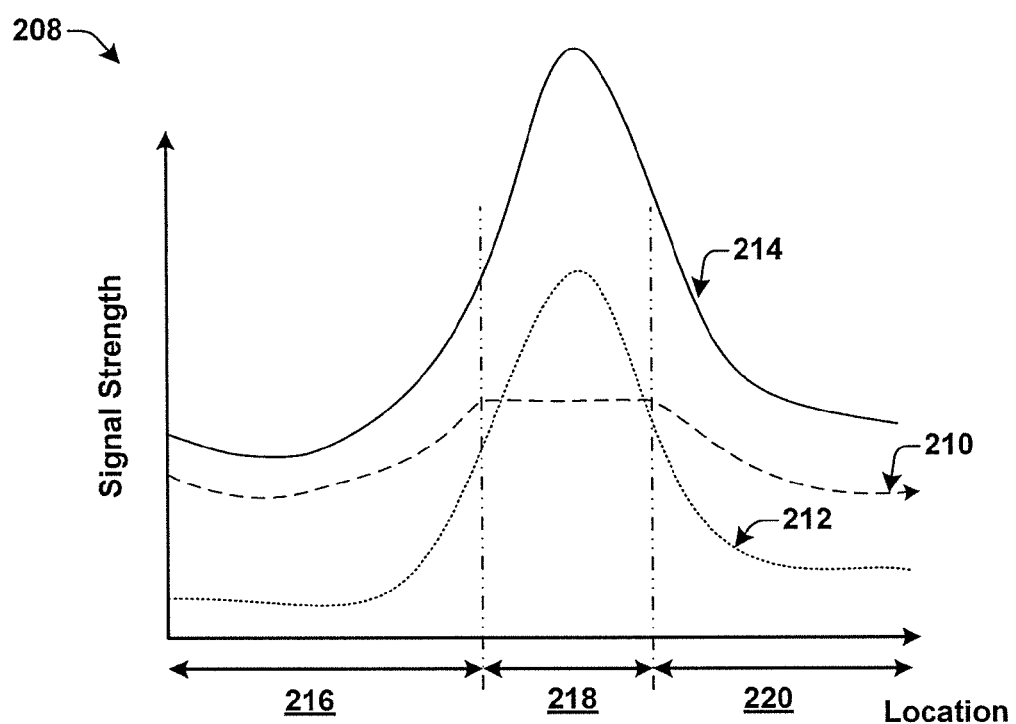
FIG. 2B illustrates a graph showing signals detected by a linear sensor, a nonlinear sensor, and a combination thereof.

FIG. 2B illustrates a graph 208 showing exemplary signals associated with the disclosed sensor system. In particular, graph 208 illustrates a nonlinear signal 210 output from a nonlinear sensor, a linear signal 212 output from a linear sensor, and a composite output signal 214 based upon a weighted sum of the nonlinear and linear signals, 210 and 212.

In a first region 216 of operation where the nonlinear sensor is not in saturation, the composite output signal 214 is dominated by the influence of the nonlinear signal 210. This is because the resolution (response) of the nonlinear sensor is better than that of the linear sensor in such a first region 216, thereby allowing the nonlinear signal 210 to better detect a physical input quantity. However, in a second region 218 where the physical input quantity is large, the nonlinear sensor is in saturation and the linear sensor is not in saturation. Therefore, in the second region 218, the composite output signal 214 is dominated by the influence of the linear signal 212, since the response of the linear sensor is better than the nonlinear sensor. In a third region 220 of operation where the nonlinear sensor is once again not in saturation, the output signal 214 is once again dominated by the influence of the nonlinear signal 210.

Although graph 208 is described in a manner that defines regions based whether a nonlinear sensor is in saturation, it will be appreciated that the disclosed sensor system is not limited to such an application. Rather, the disclosed sensor system may be used to form a weighted sum that combines signals of linear and nonlinear sensors to provide a better output signal based upon any factor that may cause one signal (e.g., the nonlinear signal) to be better than another (e.g., the linear signal).

Figure 3A:
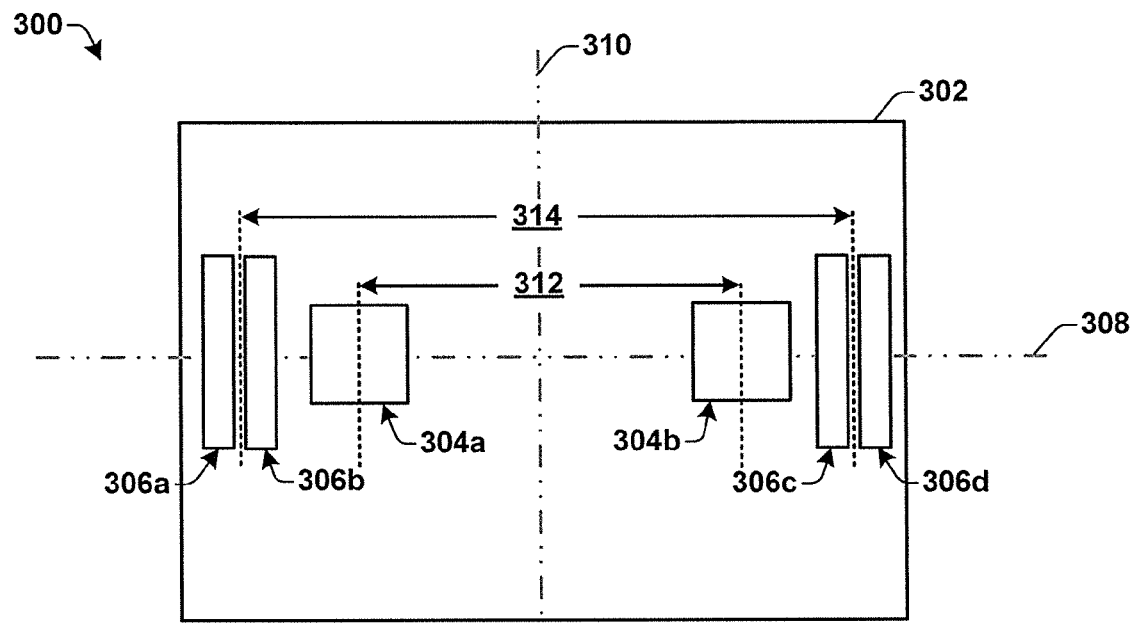
FIG. 3A illustrates some embodiments of an exemplary layout of a disclosed sensor architecture.

FIG. 3A illustrates some embodiments of an exemplary layout illustrating the position of sensor elements within a disclosed sensor system 300. The sensor system 300 comprises a linear sensor comprising a Hall sensor 304 and a nonlinear sensor comprising a giant magnetoresistive (GMR) sensor 306.

The Hall sensor 304 comprises two Hall plates 304a and 304b. A first Hall plate 304a is located on a first side of an integrated chip die 302 and a second Hall plate 304b is located on an opposite, second side of the integrated chip die 302. The GMR sensor 306 comprises four giant magnetoresistive (GMR) resistors 306a-306b, wherein two GMR resistors 306a, 306b are located on the first side of the integrated chip die 302 and two GMR resistors 306c, 306d are located on the second side of the integrated chip die 302. Both the GMR sensor 306 and Hall sensor 304 are $1^{st}$ order gradiometers (i.e., have sensors on opposite sides used to detect differential signals), so that the sensor system 300 is not influenced by homogeneous external magnetic disturbances.

In some embodiments, the first Hall plate 304a and the second Hall plate 304b are arranged symmetrically along a horizontal axis 308 and are symmetric with respect to a vertical axis 310. The two Hall plates 304a and 304b separated by a first spacing 312. In some embodiments, the first spacing 312 is between about 0.5 mm and 2.5 mm. Similarly, GMR resistors 306a and 306b and GMR resistors 306c and 306d are arranged along a horizontal axis 308 and symmetric with respect to a vertical axis 310. GMR resistors 306a and 306b are separated from GMR resistors 306c and 306d by a second spacing 314 (wherein the center of two GMR resistors on a side is located at a position that is between the two GMR resistors). In some embodiments, the second spacing 314 may have a value between 1 mm and 3 mm. In some embodiments, the Hall sensor 304 and GMR sensor 306 are comprised on a same integrated chip die 302.

In other embodiments, the first and second Hall plates 304a, 304b are arranged symmetrically along a horizontal axis 308, while the GMR resistors 306a-306d are arranged symmetrically along a vertical axis. In such an embodiment, the GMR resistors 306a-306d would be separated from one another along the vertical direction by the first spacing 312, whereas the Hall plates 304a, 304b would be separated from one another along the horizontal direction by the second spacing 314.

It will be appreciated that although FIG. 3A illustrates a sensor system 300 comprising a Hall sensor 304 having two Hall plates and a GMR sensor comprising four GMR resistors, in other embodiments the disclosed sensor system may comprise more or less sensor elements. For example, in some embodiments, the disclosed sensor system may comprise monocells (i.e. absolute field sensors having $0^{th}$ order gradiometers) having one Hall sensitive element and MR element.

Figure 3B:
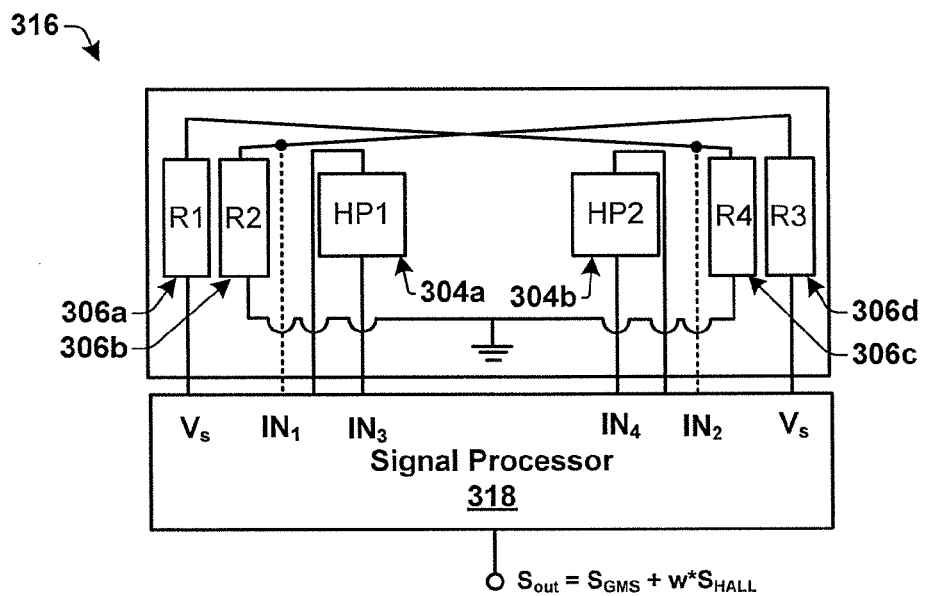
FIG. 3B illustrates a schematic diagram of the disclosed sensor architecture of the block diagram of FIG. 3A.

Electrically, the GMR resistors 306a-306d are arranged in a bridge configuration as shown in a schematic diagram 316 of the sensor system illustrated in FIG. 3B. The bridge configuration is connected such that the first GMR resistor 306a and fourth GMR resistor 306c are connected in series and the second GMR resistor 306b and third GMR resistor 306d are connected in series.

Respective GMR resistors 306a-306d comprise a non-magnetic conductive layer (e.g., copper) disposed between ferromagnetic layers. In the absence of a magnetic field, the magnetic moment in the ferromagnetic layers face in opposite directions (due to anti-ferromagnetic coupling) resulting in a high resistance. Applying an external magnetic field to the resistor overcomes the anti-ferromagnetic coupling, aligning magnetic moments in the ferromagnetic layers and causing a change in the resistance of the device (e.g., typically by 10 to 20%). The change in resistance of the GMR resistors 306a-306d allows for the bridge structure to sense an external magnetic field.

A signal processor 318 (e.g., a digital signal processor) is configured to measure a differential output signal from a point between the second and third GMR resistor 306b, 306d and a point between the first and fourth GMR resistors 306a, 306c. If the magnetic field is the same for the four resistors, the differential output signal is zero (e.g., each of the two points measure a voltage equal to ½ the supply voltage $V_s$). However, if the magnetic field is smaller on the right side of the sensor system than on the left side of the sensor system, a non-zero differential voltage will arise since the first resistor 306a will have a different resistance than the third resistor 306d. The signal processor 318 is further configured to detect a differential signal of the Hall plates 304a and 304b.

Figure 4A:
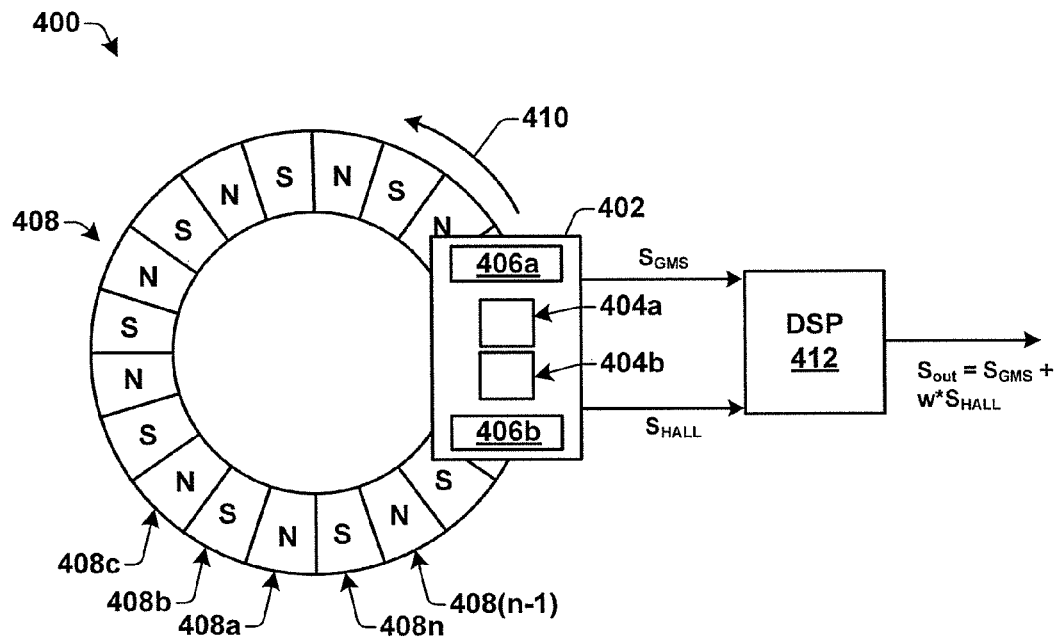
FIGS. 4A-4B illustrates application of the disclosed sensor system to a wheel speed sensor.

FIG. 4A illustrates a top view of some embodiments of a magnetic sensor configuration 400. The magnetic sensor configuration 400 comprises a magnetic sensor system 402 configured to detect a magnetic field of an active target wheel 408 for rotational speed measurement. Although the disclosed magnetic sensor system 402 is described in relation to an active target wheel, one of ordinary skill in the art will appreciate that the disclosed sensor system may alternatively be used in conjunction with passive target wheels.

The magnetic sensor system 402 is positioned along an x/y-plane on the surface of the active target wheel 408. As described below, the magnetic sensor system 402 comprises a Hall sensor 404 and a GMR sensor 406. The Hall sensor 404 comprises a first Hall plate 404a located on a first side of magnetic sensor system 402 and a second Hall plate 404b located on an opposite, second side of magnetic sensor system 402. The GMR sensor 406 comprises GMR resistors 406a, 406b located on the first side of magnetic sensor system 402 and GMR resistors 406c, 406d located on the second side of magnetic sensor system 402.

The active target wheel 408 comprises a plurality of alternating magnetic poles 408a, 408b, . . . , 408n spanning the circumference of the active target wheel 408. Adjacent poles have opposite magnetic orientations, such that a north pole (N) is located adjacent to a south pole (S).

During operation, an alternating series of magnetic north poles (N) and south poles (S) moves in a tangential direction, so that the magnetic sensor system 402 move over alternating N and S poles. As the magnetic sensor system 402 moves along the active target wheel the Hall sensor 404 and the GMR sensor 406 measure a magnetic field that alternates between a field having a first direction (e.g., N) and a field having a second direction (e.g., S).

The measured magnetic fields are output as a Hall plate output signal $S_{HALL}$ and a GMR output signal $S_{GMR}$. The output signals, $S_{HALL}$ and $S_{GMR}$, are provided to a signal processor 412. The signal processor 412 is configured to generate a composite output signal $S_{out}$ comprising a combination of the GMR and Hall plate output signals, $S_{HALL}$ and $S_{GMR}$. The composite output signal $S_{out}$ can be used to determine a rotational speed measurement based upon a counted number of magnetic poles.

In some embodiments, the Hall sensor 404 comprises lateral Hall plates configured to detect a magnetic field perpendicular to the Hall plates. In such an embodiment, the lateral Hall plates are configured to detect a magnetic field that is 90° out of phase with the magnetic field detected by the GMR sensor 406. In other embodiments, the Hall sensor 404 comprises vertical Hall plates configured to detect a magnetic field perpendicular to the plates (i.e., the direction of movement). In such an embodiment, the vertical Hall plates and the GMR sensor 406 generate signals that are in-phase and the weighted sum of both have steeper zero crossings than the pure GMR signals. Furthermore, this allows for the vertical Hall plates can detect the magnetic field in the same direction as the GMR sensor 406.

Figure 4B:
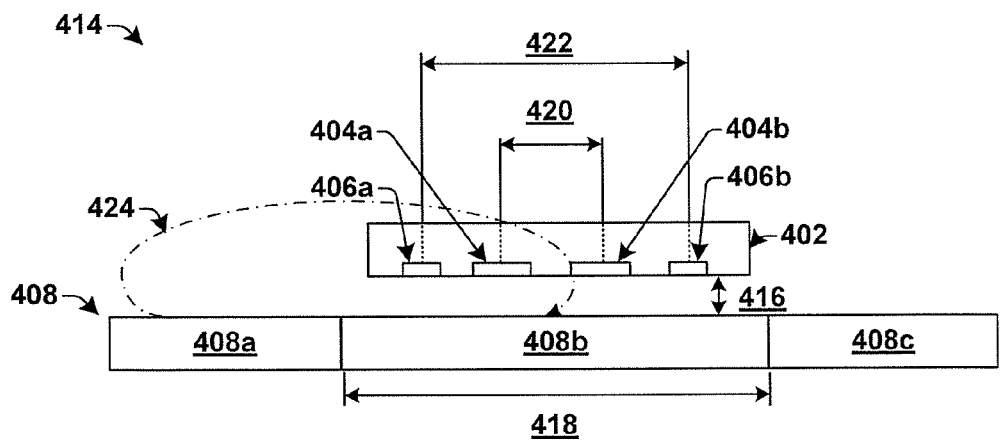

FIG. 4B illustrates a cross sectional view 414 of a magnetic sensor system 402 and an active target wheel 408.

The active target wheel 408 comprises a plurality of magnetic poles, each having a size 418 in the direction of movement. The magnetic sensor system 402 is separated from the active target wheel 408 by an air gap 416 that is equal to a distance from the surface of substrate that carries sensor elements to surface of a magnetic pole 408a, 408b, etc. within the target wheel 408.

The Hall plates, 404a and 404b, are separated from one another by a first center-to-center distance 420, while the GMR resistors, 406a and 406b, are separated from one another by a second center-to-center distance 422. In some embodiments, the first and second distances, 420 and 422, are different. In some embodiments, the first and second distances, 420 and 422, are the same.

As the size of the magnetic poles 408a, 408b, etc. increases relative to the size of the magnetic sensor system 402 (which is size limited), the right and left side of the Hall sensor 404 and GMR sensor 406 will experience a homogeneous magnetic field 424 during a same time. For example, when the spacing between GMR resistors on opposite sides of the magnetic sensor system 402 is roughly equal to the size of a magnetic pole (e.g., 408a) of the active target wheel 408, the right side of a GMR bridge structure detects a pole having a same polarity as the left side of the GMR bridge structure. When the air gap 416 is also small, the magnetic field 424 will drive opposite GMR sensors, 406a and 406b, into saturation for a certain range of positions. In the range of positions, the magnetic field cancels in both branches of the GMR bridge, causing the GMR sensor 406 to output a signal having a near zero amplitude. Over the range of positions the GMR signal does not change but rather has a small slope that stays at approximately zero (i.e., has a flat zero crossing). The small slope makes it difficult to detect a zero crossing time, since the zero crossing time may be corrupted by noise, for example.

Figure 5A:
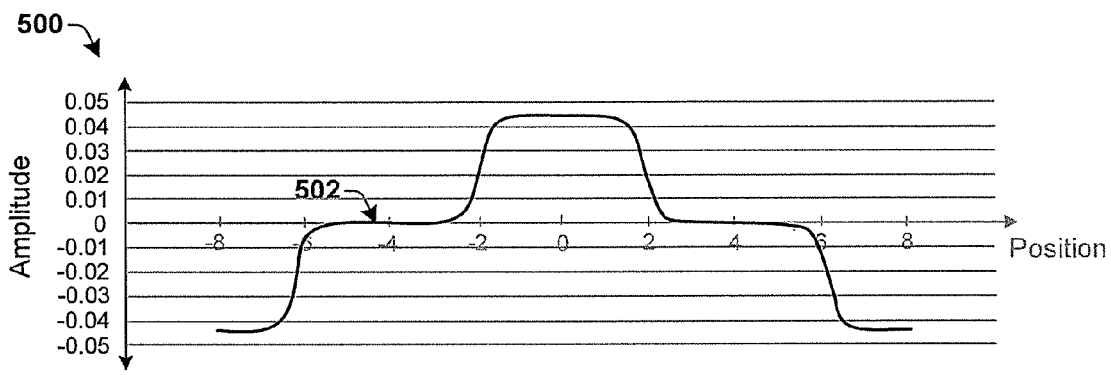
FIGS. 5A-5C illustrates graphs showing signals of the disclosed sensor architecture when applied to a wheel speed sensor.

For example, FIG. 5A illustrates a graph 500 showing the output signal of a nonlinear GMR sensor 502 having four GMR resistors connected in a bridge configuration (e.g., as shown in FIG. 3B). The horizontal axis of graph 500 corresponds to the position of the gravity center of the nonlinear GMR relative to the perimeter of the active target wheel. For graph 500 it is assumed that the nonlinear GMR sensor is configured to detect the magnetic field for poles of an active target wheel that are 4 mm long in the direction of movement. The nonlinear GMR sensor is separated from the active target wheel by an air-gap of 0.5 mm and has GMR resistors spaced apart from one another 1.9 mm in the direction of the movement.

The small air gap provides for a large magnetic field on the GMR resistors that drives the output signal of the nonlinear GMR sensor 502 into positive or negative saturation. Furthermore, the large size of the poles, relative to the spacing of the GMR resistors, causes the four GMR resistors of a bridge to sense the same magnetic pole polarity over a wide range of positions. By sensing the same magnetic pole polarity over a wide range of positions, the differential output voltage of the bridge has a value that is substantially zero even as the pole wheel moves within the range of positions. This results in regions of small slope (e.g., flat crossings) over the range of positions that give an inaccurate switching when the signal crosses zero (i.e., when the sensor system crosses between poles).

However, the Hall plates of the disclosed sensor system allow for these regions of small slope to be avoided since the Hall plates do not undergo saturation. In other words, by adding the signal of the Hall sensor to the output signal of the GMR sensor, the resulting composite output signal has a slope as it crosses zero (i.e., the regions of small slope are avoided).

Figure 5B:
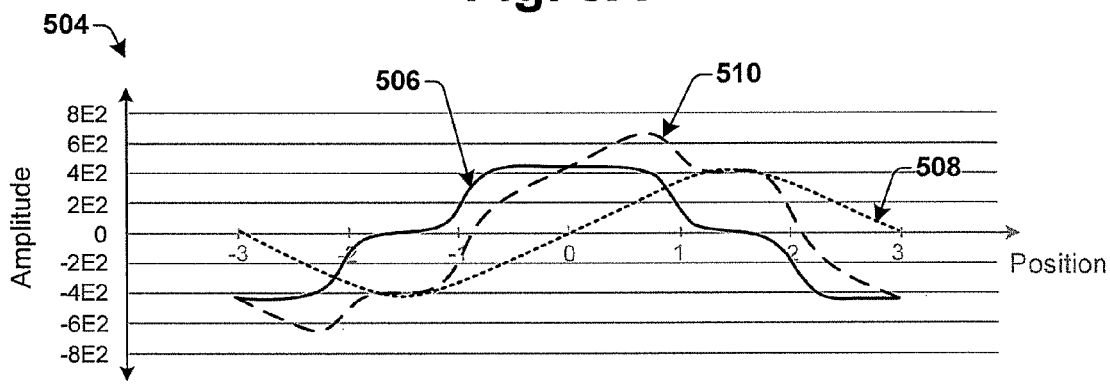

For example, FIG. 5B illustrates a graph 504 showing an output signal of a nonlinear GMR sensor 506 added to an output signal of a linear Hall sensor 508 to form a composite output signal 510. The output signals are illustrated for one period (i.e., the output signal generated as the sensor system moves over one north pole and one south pole of an encoder wheel), such that the range extends along a distance that is twice the size of a pole.

The output signals are detected using sensors configured to detect the magnetic field for poles of an active target wheel that are 3 mm long in the direction of the movement. The sensors are separated from the active target wheel by an air-gap of 1 mm. The nonlinear GMR sensor has GMR resistors spaced apart from one another 1.9 mm in the direction of the movement and the Hall sensor has Hall plates spaced apart from one another 1.3 mm in the direction of the movement.

As shown in graph 504, the output signal of the GMR sensor 506 has a non-sinusoidal signal, due to the GMR resistors undergoing saturation. The output signal of the Hall sensor 508 is sinusoidal and nearly as large in amplitude as the output signal of the GMR sensor 506, because the output signal of the Hall sensor 508 is not clipped by saturation effects. The resulting composite output signal 510 has a steep slope through the zero crossings.

Figure 5C:
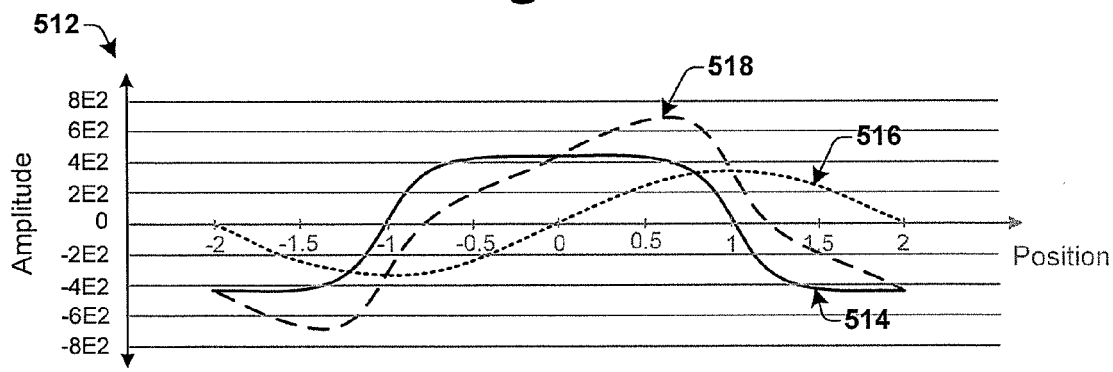

As the size of the magnetic poles decreases to become nearly identical to the spacing of the GMR sensors the zero crossings of the sensor system are eliminated. The resulting composite output signal is not degraded by the Hall plate. For example, FIG. 5C illustrates a graph 512 showing an output signal of a nonlinear GMR sensor 514 added to an output signal of a linear Hall sensor 516 to form a composite output signal 518. The output signals are detected using sensors that are separated from the active target wheel by an air-gap of 1 mm and that are configured to detect the magnetic field of poles of an active target wheel that are 2 mm long in the direction of the movement. The GMR sensor has GMR resistors spaced a 1.9 mm in the direction of the movement and to a spacing of the Hall plates of 1.3 mm in the direction of the movement. The composite output signal 518 has steep zero crossings with high switching accuracy despite the flat zero crossings of the output signal of the GMR sensor 514, due to the output signal of the Hall sensor 516.

It will be appreciated that the disclosed sensor system is configured to provide accurate readings over a broad range of operating conditions (e.g., air gaps and pole sizes). For example, FIGS. 6A-6D illustrate simulations showing application of the disclosed sensor system to air gaps between 1 mm and 16 mm and pole sizes between 5 and 8 mm long. The simulations illustrate the location of the sensor (relative to the target wheel) on the x-axis over one period and the amplitude of the signals on the y-axis.

Figure 6A:
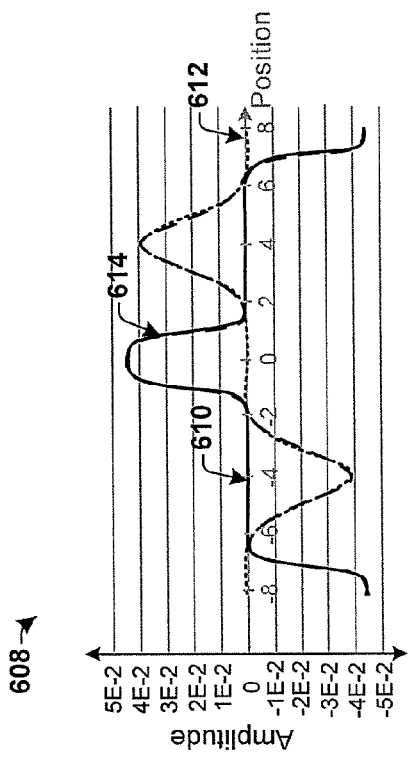
FIGS. 6A-6D illustrate graphs showing signals of the disclosed sensor architecture resulting from different pole size/air gaps combinations of a wheel speed sensor.

FIG. 6A illustrates a graph 600 showing an output signal of a nonlinear GMR sensor 602 added to an output signal of a linear Hall sensor 604 to form a composite output signal 606. The output signals are detected using sensors configured to detect the magnetic field of poles of an active target wheel that are 5 mm long in the direction of the movement. The sensors are separated from the active target wheel by an air-gap of 1 mm and have GMR resistors spaced a 1.9 mm in the direction of the movement and to a spacing of the Hall plates of 1.3 mm in the direction of the movement. As shown in graph 600, the output signal of the GMR sensor 602 has very flat zero crossings, yet the composite output signal 606 has very steep zero crossings.

Figure 6B:
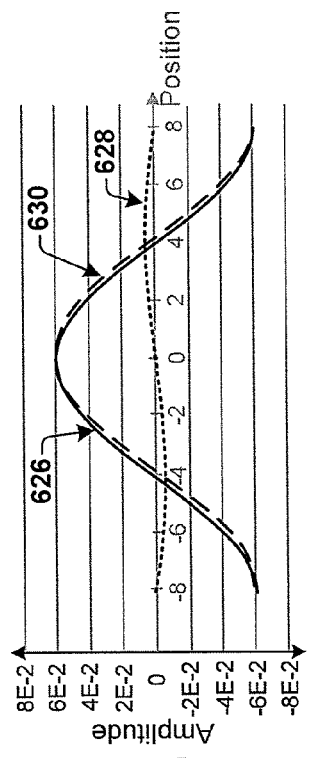

FIG. 6B illustrates a graph 608 showing an output signal of a nonlinear GMR sensor 610 added to an output signal of a linear Hall sensor 612 to form a composite output signal 614. The output signals are detected using sensors configured to detect the magnetic field of poles of an active target wheel that are 8 mm long in the direction of the movement. The sensors are separated from the active target wheel by an air-gap of 1 mm and have GMR resistors spaced a 1.9 mm in the direction of the movement and to a spacing of the Hall plates of 1.3 mm in the direction of the movement. As shown in graph 608, a dip in the composite output signal 614 "touches" the zero-line, causing the sensor system to malfunction.

Figure 6C:
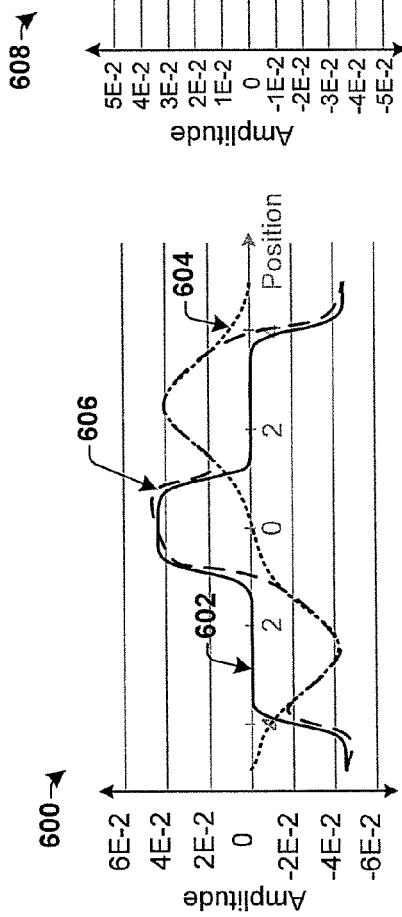

However, increasing the air-gap from 1 mm to 2 mm causes the sensor system to work properly again. For example, FIG. 6C, illustrates a graph 616 showing an output signal of a nonlinear GMR sensor 618 added to an output signal of a linear Hall sensor 620 to form a composite output signal 622. The output signals are detected using sensors configured to detect the magnetic field of poles of an active target wheel that are 8 mm long in the direction of the movement. The sensors are separated from the active target wheel by an air-gap of 2 mm and have GMR resistors spaced a 1.9 mm in the direction of the movement and to a spacing of the Hall plates of 1.3 mm in the direction of the movement. As shown in graph 616, the sensor system has a composite output signal 622 that once again has steep crossing through the zeroes. Therefore, the 8 mm poles of the target wheel can be detected by the sensor system by increasing the air gap from 1 to 2 mm.

Figure 6D:
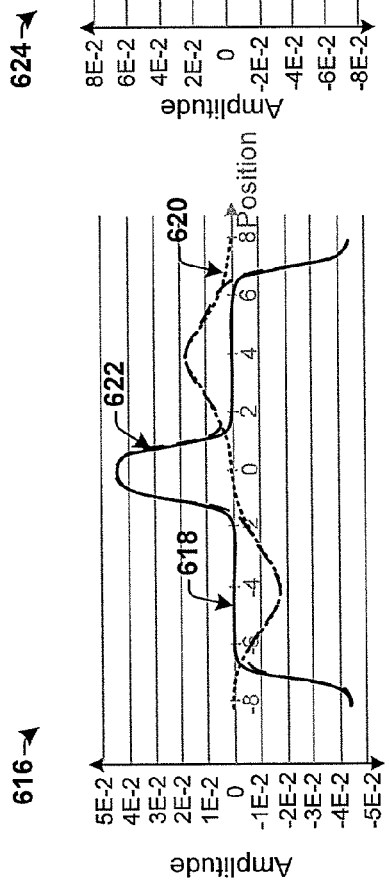

FIG. 6D illustrates a graph 624 showing an output signal of a nonlinear GMR sensor 626 added to an output signal of a linear Hall sensor 628 to form a composite output signal 630. The output signals are detected using sensors configured to detect the magnetic field of poles of an active target wheel that are 8 mm long in the direction of the movement. The sensors are separated from the active target wheel by an air-gap of 16 mm and have GMR resistors spaced a 1.9 mm in the direction of the movement and to a spacing of the Hall plates of 1.3 mm in the direction of the movement.

As shown in graph 624, the output signal of the Hall sensor 628 is small compared to the output signal of the GMR sensor 626 because the magnetic sensitivity of the GMR sensor is larger than the Hall sensor. Therefore, the composite output signal 630 is slightly phase shifted to the output signal of the GMR sensor 626. Furthermore, the signal amplitude of the composite output signal 630 is not degraded by the output signal of the Hall sensor 628 (e.g., the weighting coefficient w is chosen so that the noise from the Hall plates does not interfere with the composite output signal).

Figure 7:
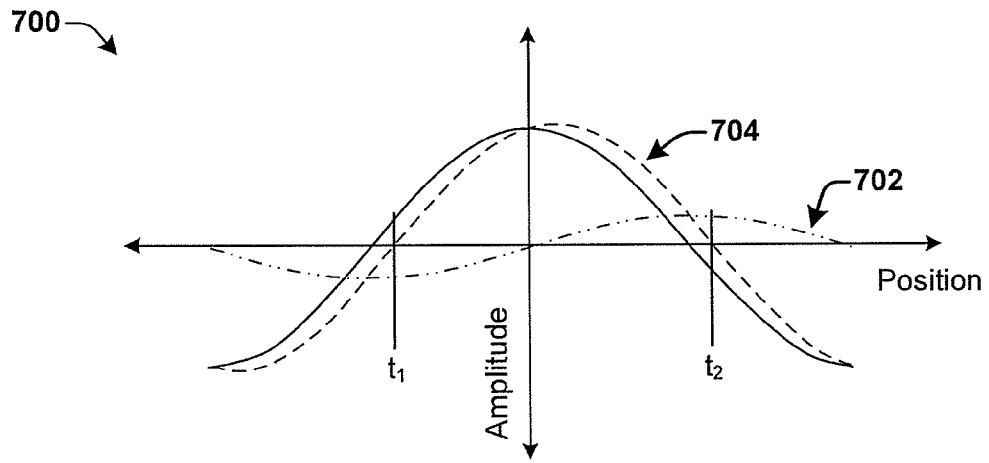
FIG. 7 is a graph illustrating the use of an output signal of a nonlinear sensor to detect a direction of movement.

In some embodiments, the disclosed sensor system is configured to detect the direction of a vehicles movement (e.g., from left to right or from right to left). FIG. 7 is a graph 700 illustrating the use of a nonlinear sensor response to detect the direction of a vehicles movement.

In such an embodiment, a signal processing unit is configured to compare the output signal of the linear sensors to the composite output signal of the sensor system and to determine a relationship between the signals that is indicative of the direction of movement. For example, the signal processing unit may determine a sign of the output signal of the Hall sensor (e.g., $S_{Hall}$) at each zero crossing. The sign of the output signal of the Hall sensor is compared to a composite output signal provided by the sensor system (e.g., $S_{out}$). The direction of movement is clock-wise if the output signal of the Hall sensor $S_{Hall}$ is positive at the rising-edge zero crossing of the composite output signal $S_{out}$ or if the output signal of the Hall sensor $S_{Hall}$ is negative at the falling edge zero crossing of the composite output signal $S_{out}$. Alternatively, the direction of movement is counter-clockwise if the output signal of the Hall sensor $S_{Hall}$ is positive at the falling edge zero crossing of the composite output signal $S_{out}$ or if the output signal of the Hall sensor $S_{Hall}$ is negative at the rising-edge zero crossing of the composite output signal $S_{out}$.

For example, as shown in graph 700, at a first time $t_1$, the direction of movement is counter-clock-wise since the output signal of the Hall sensor 702 is negative at the rising-edge zero crossing of the composite output signal 704. Alternatively, the direction of movement would be clock-wise if the output signal of the Hall sensor 702 were positive at the rising edge of the composite output signal 704. At a second time $t_2$, the direction of movement is counter-clock-wise, since the output signal of the Hall sensor 702 is positive at the falling edge zero crossing of composite output signal 704. Alternatively, the direction of movement would be clock-wise if the output signal of the Hall sensor 702 were negative at the falling edge of composite output signal 704.

Figure 8:
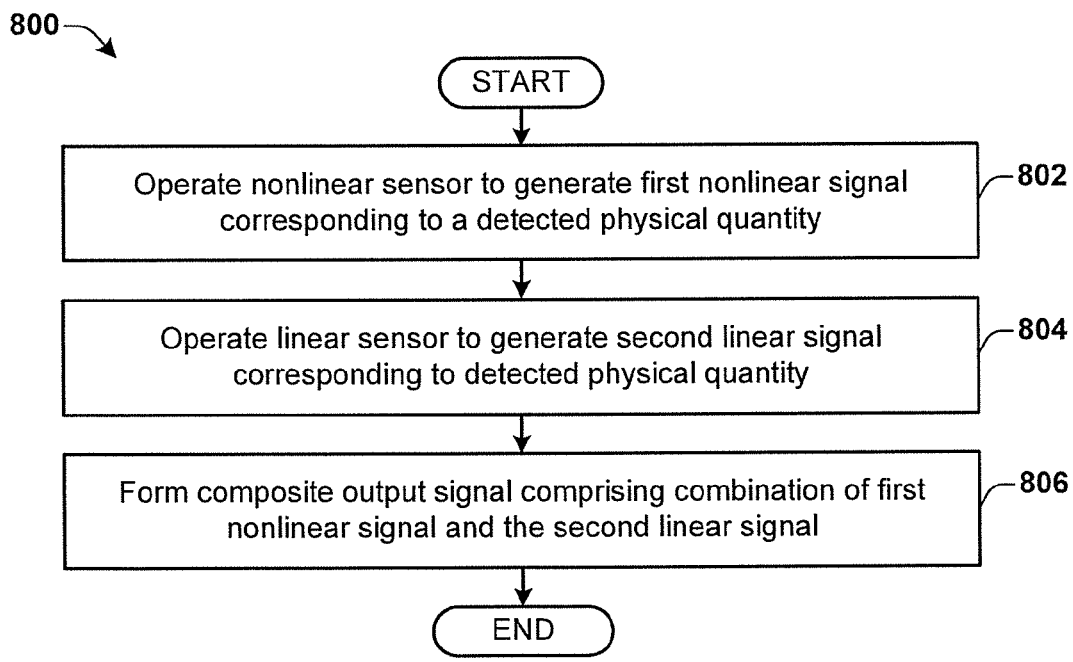
FIG. 8 illustrates a flow diagram of a method for combining linear and nonlinear sensors to increase the range between minimum and maximum allowed input quantity.

FIG. 8 illustrates a flow diagram of a method 800 for combining linear and saturation sensors to increase the range between minimum and maximum allowed input quantity.

It will be appreciated that while the method 800 is illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, the disclosed methods may be implemented as a apparatus, or article of manufacture using standard programming and/or engineering techniques to produce software, firmware, hardware, or any combination thereof to control a computer to implement the disclosed subject matter At 802 a nonlinear sensor is operated to generate a first nonlinear signal corresponding to a detected physical input quantity. The nonlinear sensor has a nonlinear response to a physical input quantity. In some embodiments, the nonlinear sensor comprises a GMR sensor having a plurality of GMR resistors.

At 804 a linear sensor is operated to generate a second linear signal corresponding to a detected physical input quantity. The linear sensor has a linear response to a physical input quantity. In some embodiments, the linear sensor comprises one or more Hall plate, which may be operated using a spinning current method in order to keep the offset error low and stable and also to cancel 1/f-noise.

At 806 a composite output signal is formed from a combination of the first and second signals. The composite output signal comprises a combination of the first nonlinear signal and the second linear signal that provides for a signal having a high sensitivity to small physical input quantities while avoiding saturation at large physical input quantities. In some embodiments, the composite outputs signal comprises a weighted sum of the first linear signal and the second nonlinear signal.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A sensor system, comprising:
   a nonlinear sensor comprising a magneto-resistive sensor configured to generate a nonlinear signal measuring a physical input quantity, wherein the nonlinear sensor enters a nonlinear saturation region of operation at a first amplitude of the physical input quantity;
   a linear sensor comprising a Hall sensor configured to generate a linear signal measuring the physical input quantity, wherein the linear sensor enters a linear saturation region of operation at a second amplitude of the physical input quantity larger than the first amplitude;
   a signal processing unit configured to determine when the nonlinear signal is in the nonlinear saturation region of operation, to apply a weighting to the linear signal or the nonlinear signal, and to generate a composite output signal corresponding to the physical input quantity, which is a combination of the weighting, the nonlinear signal, and the linear signal, wherein the weighting is applied to cause the nonlinear signal to have a smaller influence on the composite output signal than the linear signal when the nonlinear sensor is in the nonlinear saturation region of operation; and
   wherein the magneto-resistive sensor has a first magnetoresistor, a second magnetoresistor, a third magnetoresistor, and a fourth magnetoresistor; and wherein the linear sensor comprises a first Hall plate and a second Hall plate spatially arranged between the first and second magnetoresistors and the third and fourth magnetoresistors.

2. The sensor system of claim 1, wherein the physical input quantity comprises a magnetic field, an electric field, a temperature, a moisture content, a gas pressure, a mechanical stress or strain, an optical light, or a nuclear radiation.

3. The sensor system of claim 1, wherein the physical input quantity comprises a vector valued physical input quantity.

4. The sensor system of claim 3, wherein the linear sensor is configured to detect a first component of the vector valued physical input quantity and wherein the nonlinear sensor is configured to detect a second component of the vector valued physical input quantity that is orthogonal to the first component.

5. The sensor system of claim 1, wherein the Hall sensor has one or more Hall plates.

6. The sensor system of claim 5, wherein the nonlinear sensor comprises a Giant magnetoresistive sensor comprising a plurality of Giant magnetoresistive resistors.

7. The sensor system of claim 1, wherein the signal processing unit is configured to determine a direction of movement by comparing an output signal of the linear sensor with the composite output signal.

8. The sensor system of claim 1, wherein the first, second, third and fourth magnetoresistors are electrically connected in a bridge configuration.

9. The sensor system of claim 1, wherein the weighting causes the nonlinear signal to have a larger influence on the composite output signal than the linear signal when the nonlinear sensor is outside of the nonlinear saturation region of operation.

10. The sensor system of claim 1, wherein the linear sensor and the nonlinear sensor are located on an integrated chip die within an integrated chip package.

11. The sensor system of claim 1, wherein the weighting is configured to switch the composite output signal, from having a larger influence from the nonlinear signal than the linear signal to having a larger influence from the linear signal than the nonlinear signal, at a saturation region in which the nonlinear signal does not accurately measure the physical input quantity.

12. The sensor system of claim 1, wherein the weighting comprises a value stored in an on-chip memory.

13. A method of operating a sensor system to detect a physical input quantity, comprising:
   operating a nonlinear sensor comprising a magneto-resistive sensor to generate a nonlinear signal having a first value measuring a physical input quantity, wherein the nonlinear sensor enters a nonlinear saturation region of operation at a first amplitude of the physical input quantity;
   operating a linear sensor comprising a Hall sensor to generate a linear signal having a second value measuring the physical input quantity, wherein the linear sensor enters a linear saturation region of operation at a second amplitude of the physical input quantity larger than the first amplitude;

operating a signal processing unit to determine when the nonlinear signal is in the nonlinear saturation region of operation and to generate a composite output signal, corresponding to the physical input quantity, which is a combination of the nonlinear signal and the linear signal, wherein the composite output signal comprises a weighted sum having one or more weightings that cause the nonlinear signal to have a smaller influence on the composite output signal than the linear signal when the nonlinear sensor is in the nonlinear saturation region of operation; and determining a direction of movement by comparing the linear signal with the composite output signal.

14. The method of claim 13, wherein the physical input quantity comprises a magnetic field, an electric field, a temperature, a moisture content, a gas pressure, a mechanical stress or strain, an optical light, or a nuclear radiation.

15. The method of claim 13, wherein the one or more weightings cause the nonlinear signal to have a larger influence on the composite output signal than the linear signal when the nonlinear sensor is outside of the nonlinear saturation region of operation.

16. The method of claim 15,
wherein the composite output signal comprises the nonlinear signal added to a product of one of the one or more weightings multiplied by the linear signal,
wherein the one or more weightings are determined by an algorithm configured to adjust the one or more weightings during operation of the sensor system.

17. The method of claim 13, wherein the physical input quantity comprises a vector valued physical quantities.

18. A sensor system, comprising:
a nonlinear sensor comprising a magneto-resistive sensor configured to take a first measurement of a strength of a magnetic field and to generate a nonlinear signal from the first measurement;
a linear sensor comprising a Hall sensor configured to take a second measurement of the strength of the magnetic field and to generate a linear signal from the second measurement;
a signal processing unit configured to generate a composite output signal corresponding to the strength of the magnetic field, which is a weighted sum that assigns different weightings to the nonlinear signal and the linear signal, wherein the different weightings cause the nonlinear signal to have a smaller influence on the composite output signal than the linear signal when the nonlinear sensor is in a saturation region of operation; and
wherein the nonlinear signal has a substantially flat slope within a first region at which the nonlinear signal crosses through zero amplitude, and wherein the composite output signal has a steep slope as it passes through the first region.

19. The sensor system of claim 18, wherein the different weightings cause the nonlinear signal to have a larger influence on the composite output signal than the linear signal when the nonlinear sensor is outside of the saturation region of operation.

* * * * *